United States Patent [19]

Chism

[11] Patent Number: 5,015,947

[45] Date of Patent: May 14, 1991

[54] LOW CAPACITANCE PROBE TIP

[75] Inventor: Warren L. Chism, Vancouver, Wash.

[73] Assignee: Tektronix, Inc., Beaverton, Oreg.

[21] Appl. No.: 495,176

[22] Filed: Mar. 19, 1990

[51] Int. Cl.$^5$ .................... G01R 31/22; H01R 39/00
[52] U.S. Cl. .......................... 324/158 P; 324/72.5; 324/158 F; 439/80
[58] Field of Search ............ 324/158 F, 158 P, 72.5; 439/482, 751, 873, 80; 369/173

[56] References Cited

U.S. PATENT DOCUMENTS

| | | | |
|---|---|---|---|
| 1,508,163 | 9/1924 | Clifton | 369/173 |
| 2,660,438 | 11/1953 | Holtz, Jr. | 369/173 |
| 2,670,962 | 3/1954 | Holtz, Jr. | 369/173 |
| 3,613,001 | 10/1971 | Hostetter | 324/72.5 |
| 3,812,311 | 5/1974 | Kvaternik | 324/158 P |
| 4,773,877 | 9/1988 | Kruger et al. | 324/158 P |

*Primary Examiner*—Kenneth Wieder
*Assistant Examiner*—Vinh P. Nguyen
*Attorney, Agent, or Firm*—Francis I. Gray; William K. Bucher

[57] ABSTRACT

A low capacitance probe tip, having minimal metal content to reduce loading on a circuit under test, is formed from a small diameter wire. The small diameter wire had a straight section, a formed section and a pointed front end section. The major dimension of the formed section is slightly greater than the interior diameter of a small diameter hole in a probe body so that, when inserted into the small diameter hole, the formed section forms an interference fit with the hole to securely hold the probe tip in the probe body. The probe tip within the hole makes electrical contact with a hybrid electrical circuit board having an electrical contact at the small diameter hole. The formed section shrinks when pulled for either insertion or replacement, and expands to form the interference fit when the pulling tension is removed. Thus the probe tip is readily replaceable.

5 Claims, 2 Drawing Sheets

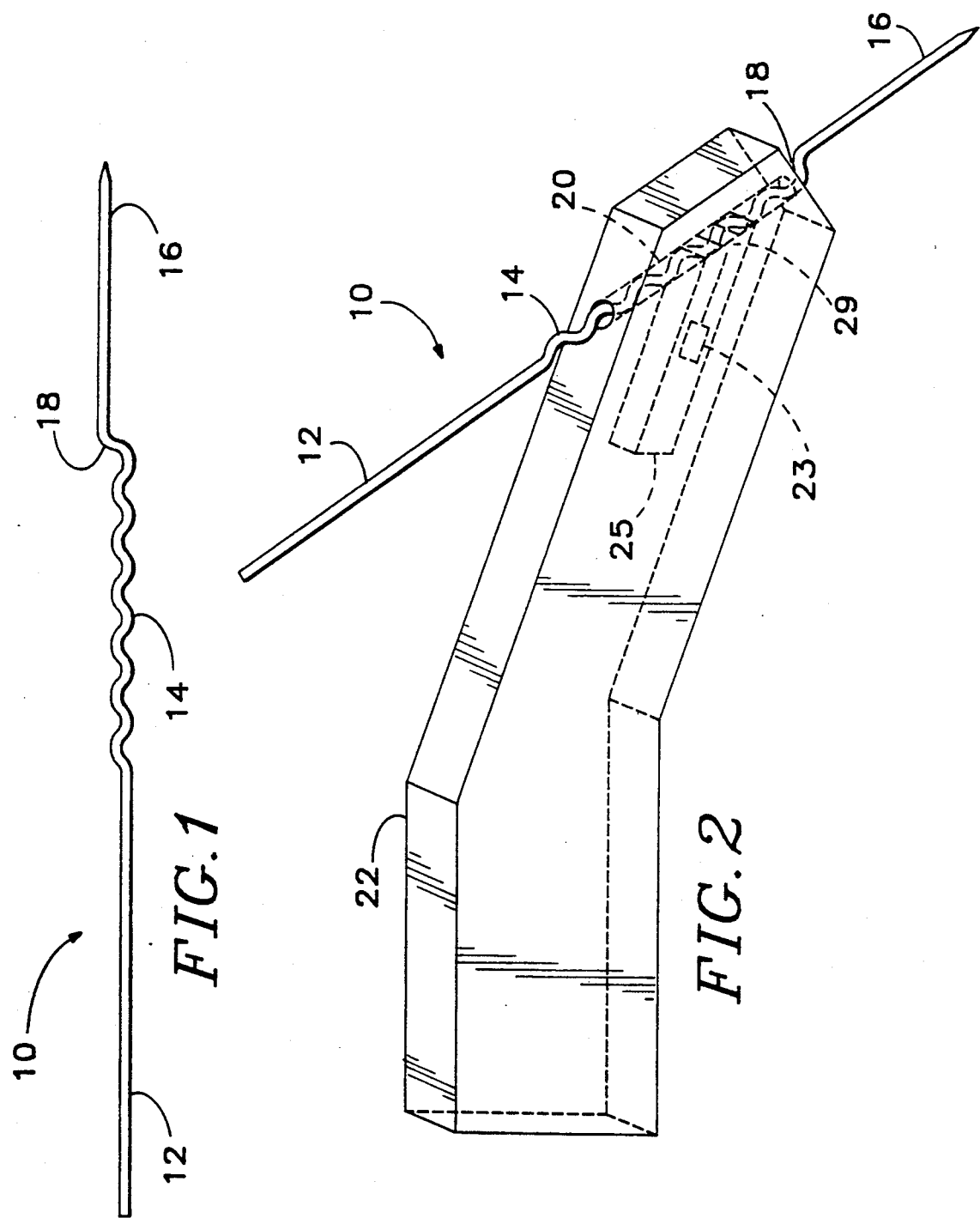

LOW CAPACITANCE PROBE TIP

BACKGROUND OF THE INVENTION

The present invention relates to electrical measurement probes, and more particularly to a low capacitance probe tip having a configuration that minimizes the amount of metal in the probe tip in order to reduce the loading that the probe tip presents to a circuit under test and that is readily replaceable in a probe tip holder.

In most current low capacitance probes the probe tip contains significant amounts of metal that are subject to parasitic capacitance, resulting in unacceptable loading of a circuit under test. These probe tips have a usually relatively large diameter shank that fits into a corresponding large diameter metal receptacle within a probe body. The total capacitive loading presented to the circuit under test is on the order of one picofarad or greater.

One manufacturer, GGB Industries, Inc. of Naples, Florida, produces low capacitance probes that provide capacitive loading of less than one picofarad, but when the probe tip becomes worn or damaged the tip and tip housing, or holder, need to be replaced together.

What is desired is a low capacitance probe tip that minimizes the amount of metal in the probe tip to reduce the loading presented to a circuit under test, with the probe tip being readily replaceable in a probe head or holder.

SUMMARY OF THE INVENTION

Accordingly the present invention provides a low capacitance probe tip having a minimal amount of metal to reduce the loading that the probe tip presents to a circuit under test which is readily replaceable in a probe head or holder. The probe tip is a small diameter, 10 microns to 7 mils, wire that has three sections: a straight section, a formed section and a pointed front end section. The probe tip is inserted into a probe body, or probe tip holder, having a small diameter hole. The slight interference fit between the major dimension of the formed section and the inner diameter of the small diameter hole is sufficient to hold the probe tip in place in the probe body once inserted in the holder. The formed section of the probe tip shrinks in diameter or major dimension when inserted into the probe holder hole and pulled from the straight section end. When the tension of insertion is released, the formed section expands to lock the probe tip in place. The probe holder has a hybrid circuit board that the probe tip contacts directly when inserted in the hole to complete an electrical circuit between the device being probed and the hybrid board circuitry.

The objects, advantages and novel features of the present invention are apparent from the following detailed description when read in conjunction with the appended claims and attached drawing.

BRIEF DESCRIPTION OF THE DRAWINGS

FIG. 1 is a side plan view of a low capacitance probe tip according to the present invention.

FIG. 2 is a perspective view of the low capacitance probe tip mounted in a probe body, or probe holder, according to the present invention.

DESCRIPTION OF THE PREFERRED EMBODIMENT

Figure 3:
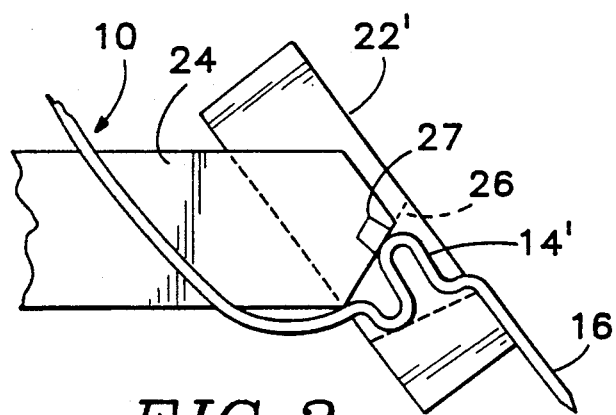
FIG. 3 is a side plan view of an alternate embodiment of the low capacitance probe tip mounted in a holder according to the present invention.

Referring now to FIG. 1 a low capacitance probe tip is in the form of a small wire 10, such as from 10 microns to 7 mils in diameter, that has a straight section 12, a formed section 14 and a pointed front end section 16. A bend 18 between the formed section 14 and the pointed front end section 16 offsets the longitudinal axis of the pointed front end section from the common longitudinal axis of the straight section 12 and the formed section. The wire 10 may be of any high strength, conductive material, such as tungsten.

As shown in FIG. 2 the low capacitance probe tip 10 is inserted into a small diameter hole 20 of a probe body, or probe holder, 22 so that the major dimension of the formed section 14 engages the interior surface of the small diameter hole 20. The diameter of the small diameter hole 20 is slightly less than the major dimension of the formed section 14 to provide an interference fit between the probe tip 10 and the probe body 22 that holds the probe tip in place. As the probe tip 10 is pulled into the small diameter hole 20 the formed section 14 shrinks. Once the probe tip 10 is in position and the pulling tension is released, the formed section 14 expands to form the interference fit. Electrical connection between the probe tip 10 and probe circuitry is made directly to a hybrid circuit 25 board embedded within the probe holder 22 via a wraparound conductive strip 29 on the hybrid circuit board that accesses the small diameter hole so that an electrical circuit is completed between the device being probed and the probe electronic circuitry.

To use the probe tip 10 the tip is inserted into the small diameter hole 20 with the straight section first, allowing the user to handle the tip without touching the pointed front end, which eliminates the risk of damaging the point. When the straight section 12 extends from the other end of the small diameter hole 20, the user then pulls the straight section until the formed section 14 is situated in the hole and the bend 18 abuts the entry of the hole. The excess of the probe tip 10 that extends from the top of the hole 20 may then be broken off at a swage or cut off. Only 1½ to 2 turns of a helical coil for the formed section 14 need to be captured in the small diameter hole 20 to hold the tip 10 securely in place. The resulting tip loading of a circuit under test using the probe tip is on the order of 50-60 femtofarads, better than one order of magnitude of improvement over most of the prior low capacitance probe tips.

Figure 4:
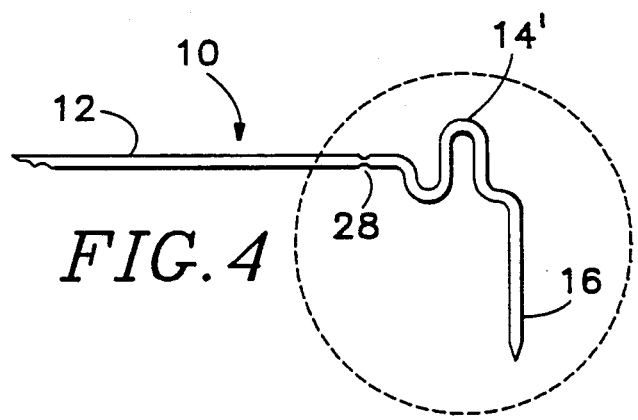
FIG. 4 is a side plan view of an alternative embodiment of the low capacitance probe tip according to the present invention.
Figure 5A:
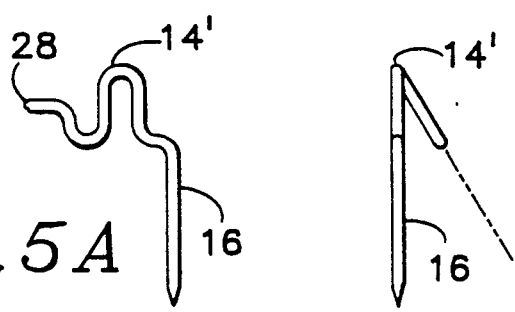
FIGS. 5a and 5b are detailed views of the tip of the low capacitance probe tip of FIGS. 3 and 4.
Figure 5B:
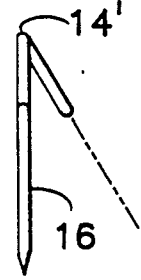

As shown in FIG. 3 a hybrid circuit board 24 holds a modified probe tip holder 22' having a tapered hole 26. The hybrid circuit board 24 is electrically coupled to the tapered hole 26 by means of a wraparound strip or a metal clip 27, as discussed above. Alternatively a protrusion from the hybrid circuit board 24 may extend into the hole 26, with the probe tip formed section 14 butting up against the protrusion. The probe wire 10, as shown in greater detail in FIGS. 4-5, has a modified formed section in that an S-section 14' is formed in the wire adjacent the tip section 16, the S-section having a small loop and a larger loop. The S-section 14' and the straight section 12 are separated by a swage 28 for easy breakage when the probe tip needs to be replaced. Again the wire 10 is inserted into the wider opening of the tapered hole 26 until the S-section 14' engages the walls of the hole and the tip end 16 rests against the outer edge of the probe holder 22'. The straight section 12 may be bent into a curve, either a continuous curve or a segmented curve, to keep the wire away from the work surface to be probed, and angled at the end of the last loop with respect to the plane of the S-section 14' so that it clears the hybrid circuit board 24.

Figure 6:
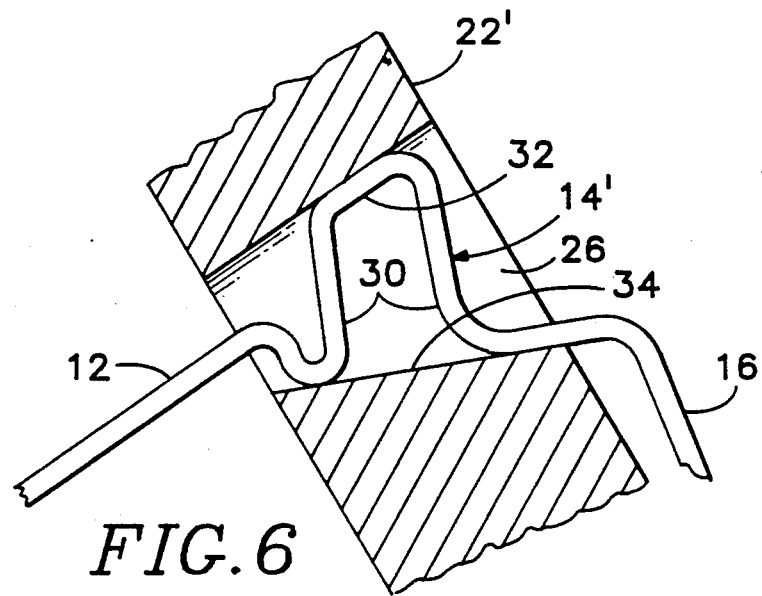
FIG. 6 is a partial cross-sectional view of the probe holder of FIG. 4 illustrating the detent action of the probe tip with the tapered hole.

The taper of the hole 26 and the taper in the outline of the S-section 14' act as a funnel for ease of insertion of the probe tip 10 into the probe holder 22', and also act as a detectable detent. As shown in FIG. 6 the two upright portions 30 of the S-section 14' on either side of the large loop 32 become nearly straight and perpendicular to the floor 34 of the hole 26. The upright portions 30 create a pair of columns supporting the loop 32 so that the inserter feels that the S-section 14' has bottomed out.

Although the hybrid circuit boards shown in the respective figures indicate a blade type configuration, for certain applications a horizontal type configuration may be preferrable due to vertical space limitations, with the probe tip held as described above at a tapered end of the hybrid circuit board.

Thus the present invention provides a low capacitance probe tip configured from a small diameter wire that has a straight section, a formed section and a pointed front end section, the probe tip being inserted into a small diameter hole in a probe body such that there is an interference fit between the formed section and the hole to hold the tip securely in place while the probe tip may be readily replaced.

What is claimed is:

1. A low capacitance probe comprising:
   a probe body having a small diameter hole;
   a low capacitance probe tip formed form a small diameter wire and inserted into the small diameter hole, the low capacitance probe tip having a straight section contiguous with a formed section and a pointed front end with the longitudinal axis of the pointed front end offset and parallel from the longitudinal axis of the formed section, the straight section being inserted through the hole in the probe body with the offset pointed front end providing an abutting stop for the probe tip as the formed section is pulled into the hole of the probe body by force allied to the straight section, the formed section having a dimension that forms an interference fit with the hole in the probe body to hold the low capacitance probe tip securely in the probe body; and
   means for electrically connecting the low capacitance probe tip to an external probe circuit.

2. A low capacitance probe tip as recited in claim 1 wherein the formed section comprises a helical shaped section having a small number of turns.

3. A low capacitance probe as recited in claim 1 wherein the small diameter hole is a tapered hole and the formed section is an S-shaped section having a small loop and a large loop.

4. A low capacitance probed as recited in claim 1 wherein the probe body comprises a hybrid electrical circuit having an electrical contact at the small diameter hole such that when inserted the probe tip makes electrical contact with the hybrid electrical circuit.

5. A low capacitance probe comprising:
   a hybrid electrical circuit board;
   a probe tip body having a tapered hole therethrough with the probe tip body fixedly mounted to the hybrid electrical circuit board so that an electrical contact of the hybrid electrical circuit board is exposed at the tapered hole; and
   a low capacitance probe tip formed from a small diameter wire and inserted into the tapered hole, the low capacitance probe tip having a straight section contiguous with a tapered S-shaped section and a pointed front end with the longitudinal axis of the pointed front end normal to the longitudinal axis of the tapered S-shaped section, the straight section being inserted through the tapered hole in the probe body with S-shaped section engaging the interior walls of the tapered hole in an interference fit to hold the probe tip fixedly in place as the S-shaped section is pulled into the tapered hole by force applied to the straight section, the probe tip making electrical contact with the electrical contact when so inserted.

* * * * *